(12) United States Patent
Higashi et al.

(10) Patent No.: US 11,362,484 B2
(45) Date of Patent: Jun. 14, 2022

(54) LIGHT-EMITTING-ELEMENT HOUSING MEMBER, ARRAY MEMBER, AND LIGHT EMITTING DEVICE

(71) Applicant: KYOCERA CORPORATION, Kyoto (JP)

(72) Inventors: Toshifumi Higashi, Kirishima (JP); Sentaro Yamamoto, Kagoshima (JP); Youji Furukubo, Kirishima (JP); Takafumi Yamaguchi, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 29 days.

(21) Appl. No.: 16/648,276

(22) PCT Filed: Sep. 18, 2018

(86) PCT No.: PCT/JP2018/034407
§ 371 (c)(1),
(2) Date: Mar. 18, 2020

(87) PCT Pub. No.: WO2019/059164
PCT Pub. Date: Mar. 28, 2019

(65) Prior Publication Data
US 2020/0220320 A1      Jul. 9, 2020

(30) Foreign Application Priority Data

Sep. 19, 2017  (JP) .............................. JP2017-179061

(51) Int. Cl.
*H01S 5/02208* (2021.01)
*H01S 5/40* (2006.01)
*H01S 5/02257* (2021.01)

(52) U.S. Cl.
CPC ...... *H01S 5/02208* (2013.01); *H01S 5/02257* (2021.01); *H01S 5/4025* (2013.01)

(58) Field of Classification Search
CPC ............. H01S 5/02208; H01S 5/02257; H01S 5/4025; H01S 5/4031; H01S 5/02469; H01S 5/02476; H01S 5/02326; H01S 5/0222
See application file for complete search history.

(56) References Cited

U.S. PATENT DOCUMENTS 5,278,859 A  *  1/1994  Arndt ...................... H01S 3/086
                                                                  372/64
5,313,482 A  *  5/1994  Zelenka .............. H01S 5/06209
                                                                  372/26
(Continued)

FOREIGN PATENT DOCUMENTS

JP     H08228045 A    9/1996
JP     H09138329 A    5/1997
(Continued)

*Primary Examiner* — Xinning (Tom) Niu
(74) *Attorney, Agent, or Firm* — Viering, Jentschura & Partner MBB

(57) ABSTRACT

A light-emitting-element housing member includes: a bottom base material having a first surface, and a mounting part on the first surface on which a light emitting element is to be mounted; and a frame member that includes side walls erected on the first surface to surround the mounting part, and an opening that penetrates through one of the side walls. The opening includes an inner edge having a first side and a second side, the first side extends along the first surface and is arranged at a position close to the bottom base material, and the second side extends along the first surface and is arranged at a position far from the bottom base material, and the second side is longer than the first side. An array of the plurality of light-emitting-element housing members, and a light emitting device are also described.

23 Claims, 12 Drawing Sheets

(56) References Cited

U.S. PATENT DOCUMENTS

| | | | |
|---|---|---|---|
| 5,675,685 A | 10/1997 | Fukuda et al. | |
| 2002/0196824 A1* | 12/2002 | Althaus | G02B 6/4215 |
| | | | 372/36 |
| 2006/0159146 A1* | 7/2006 | Iwayama | B82Y 20/00 |
| | | | 372/49.01 |
| 2007/0253667 A1* | 11/2007 | Brunner | H01L 31/0203 |
| | | | 385/92 |
| 2010/0128750 A1* | 5/2010 | Fukuda | H01S 5/02375 |
| | | | 372/50.121 |
| 2011/0280266 A1 | 11/2011 | Hayashi et al. | |
| 2012/0033696 A1 | 2/2012 | Hayashi et al. | |
| 2012/0057828 A1 | 3/2012 | Mitamura et al. | |
| 2015/0146423 A1 | 5/2015 | Sasamuro et al. | |
| 2016/0268770 A1* | 9/2016 | Tazawa | H01S 5/02216 |
| 2018/0145478 A1 | 5/2018 | Sakai et al. | |

FOREIGN PATENT DOCUMENTS

| | | |
|---|---|---|
| JP | 2005235864 A | 9/2005 |
| JP | 2011044694 A | 3/2011 |
| JP | 2012054466 A | 3/2012 |
| JP | 2012054527 A | 3/2012 |
| JP | 2014022650 A | 2/2014 |
| JP | 2015130461 A | 7/2015 |
| JP | 2015226017 A | 12/2015 |
| JP | 2016066798 A | 4/2016 |
| JP | 2016167492 A | 9/2016 |
| JP | 2017069267 A | 4/2017 |
| WO | 2016171103 A1 | 10/2016 |

* cited by examiner

LIGHT-EMITTING-ELEMENT HOUSING MEMBER, ARRAY MEMBER, AND LIGHT EMITTING DEVICE

CROSS-REFERENCE TO RELATED APPLICATIONS

This application is a national stage entry according to 35 U.S.C. 371 of PCT Application No. PCT/JP2018/034407 filed on Sep. 18, 2018, which claims priority to Japanese Application No. 2017-179061 filed on Sep. 19, 2017, which are entirely incorporated herein by reference.

TECHNICAL FIELD

The present disclosure relates to a light-emitting-element housing member, an array member, and a light emitting device.

BACKGROUND

Recently, a need has developed for a projector or a head-mounted display used for projecting an image, a light emitting device of which light emitting source is a semiconductor laser, for example. The semiconductor laser has features that light emitting intensity is high and light condensing property is well (see Patent Literature 1, for example).

CITATION LIST

Patent Literature

Patent Literature 1: Japanese Patent Application Laid-open No. 2016-167492

SUMMARY

A light-emitting-element housing member includes: a bottom base material that includes a first surface, and a mounting part on the first surface on which a light emitting element is to be mounted; and a frame member that includes side walls erected on the first surface to surround the mounting part, and an opening that penetrates through one of the side walls, wherein the opening includes an inner edge having a first side and a second side, the first side extending along the first surface and arranged at a position close to the bottom base material, and the second side extending along the first surface and arranged at a position farther from the bottom base material than the first side, and the second side is longer than the first side.

With an array member, the plurality of light-emitting-element housing members is connected.

A light emitting device according to the present disclosure includes a light emitting element mounted on the mounting part of the light-emitting-element housing member.

DESCRIPTION

Figure 1:
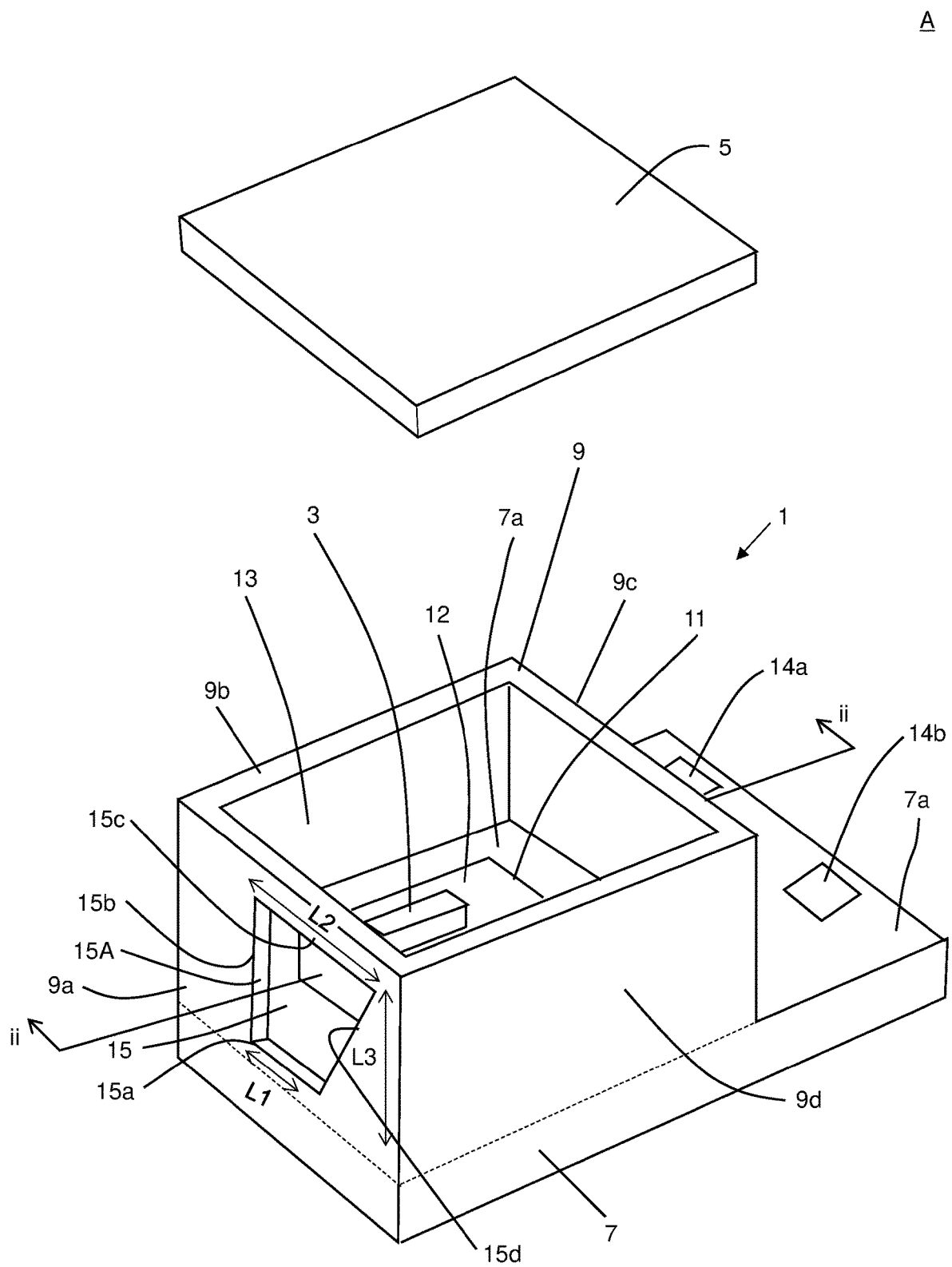
FIG. 1 is an exploded perspective view schematically illustrating embodiments of a light emitting device.
Figure 2:
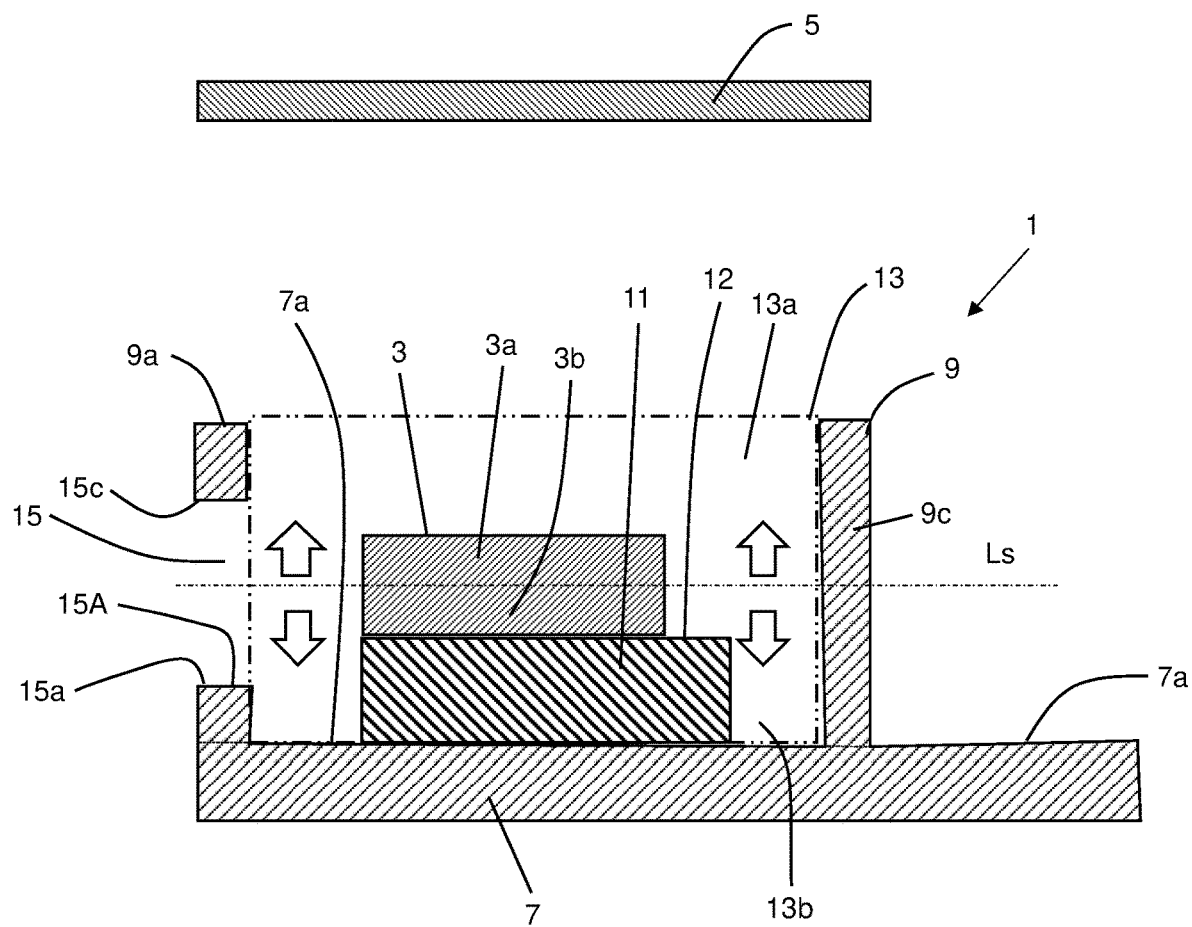
FIG. 2 is a cross-sectional view taken along a line ii-ii illustrated in FIG. 1.
Figure 3:
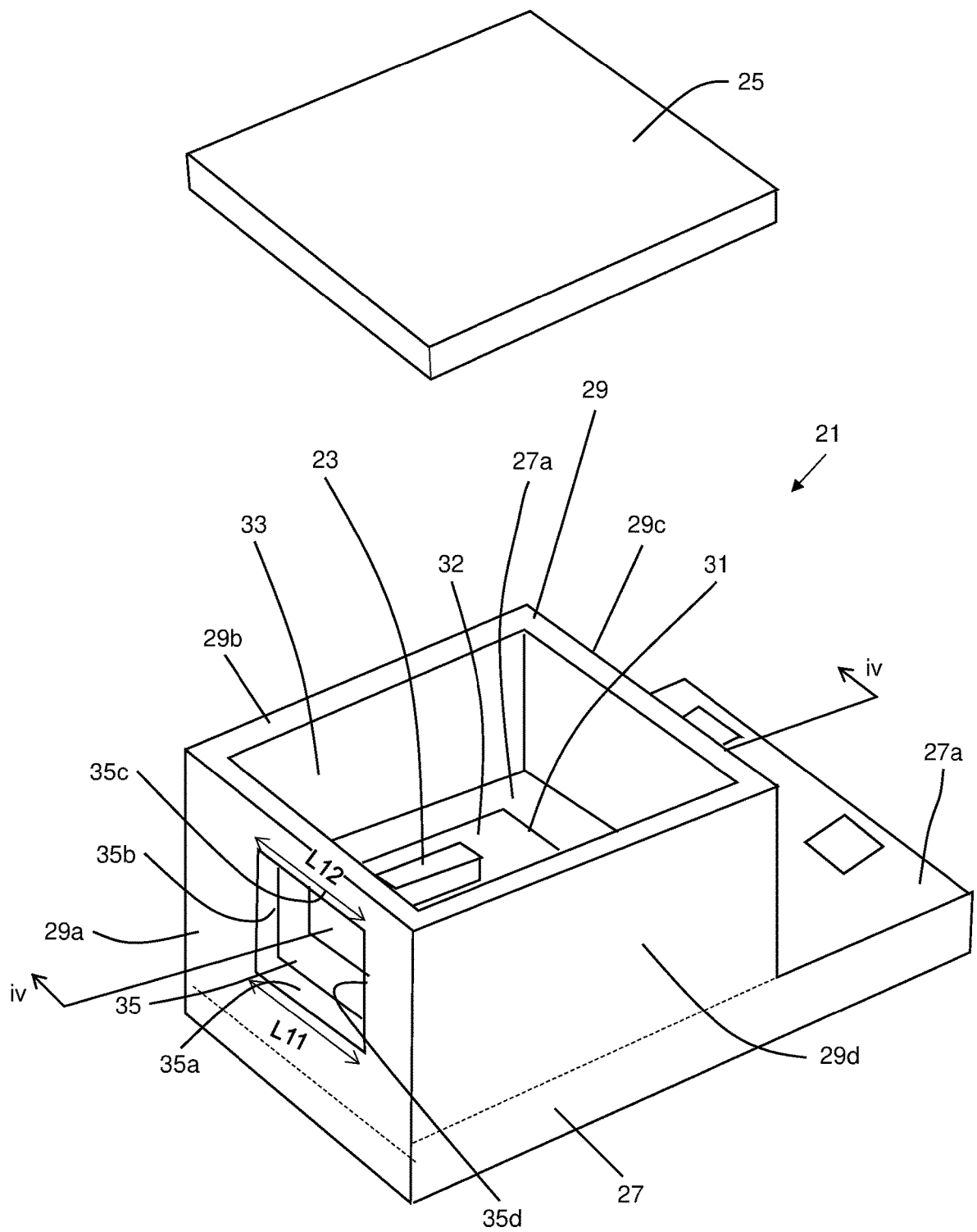
FIG. 3 is an exploded perspective view illustrating other modes of the light emitting device.

FIG. 1 is an exploded perspective view schematically illustrating embodiments of a light emitting device. FIG. 2 is a cross-sectional view taken along a line ii-ii illustrated in FIG. 1. FIG. 3 is an exploded perspective view illustrating other modes of the light emitting device. Note that the cross-sectional view taken along the line ii-ii illustrated in FIG. 1 indicates a surface perpendicular to a first surface 7a through the line ii-ii. A direction directed by arrows at both ends of the line ii-ii indicates a direction in which the cross-sectional view taken along the line ii-ii is viewed. The cross-sectional view taken along the line iv-iv illustrated in FIG. 3 indicates a surface perpendicular to a first surface 27a through the line iv-iv. A direction directed by arrows at both ends of the line iv-iv indicates a direction in which the cross-sectional view taken along the line iv-iv is viewed.

A light emitting device A includes a light-emitting-element housing member 1, a light emitting element 3, and a lid part 5. In the light emitting device A, the light emitting element 3 is stored in the light-emitting-element housing member 1. The lid part 5 is arranged so as to put a lid on the light-emitting-element housing member 1. The light-emitting-element housing member 1 includes a bottom base material 7 and a frame member 9. The bottom base material 7 has the first surface 7a opened to the upper side, and a second surface on an opposite side of the first surface 7a. The bottom base material 7 includes a base 11 arranged on the first surface 7a. A surface of the base 11 includes a mounting part 12 for mounting thereon the light emitting element 3. In the bottom base material 7, a surface opposite to the first surface 7a is the second surface.

Hereinafter, for convenience of explanation, a space that is surrounded by the lid part 5, the bottom base material 7, and the frame member 9 may be referred to as a space part 13. Behind the frame member 9 arranged on the bottom base material 7, there are arranged two terminals for power source 14a and 14b that are used for connection to an external power source.

The frame member 9 is placed on the first surface 7a of the bottom base material 7. The frame member 9 is arranged so as to surround the mounting part 12. The frame member 9 includes side walls 9a, 9b, 9c, and 9d that are erected on the first surface 7a. The frame member 9 includes an opening 15 in one (in this case, 9a) of the four side walls 9a, 9b, 9c, and 9d. The opening 15 penetrates through the side wall 9a.

The opening 15 includes, as an inner edge 15A, a first side 15a that is extending along the first surface 7a and is arranged closer to the bottom base material 7, and a second side 15c that is extending along the first surface 7a and is arranged further from the bottom base material 7. In this case, the second side 15c is longer than the first side 15a in the inner edge 15A.

With reference to FIG. 1, in the light-emitting-element housing member 1, a length "L2" of the second side 15c is longer than a length "L1" of the first side 15a, which are constituting the opening 15. Namely, in the opening 15, a width (length "L2") of the inner side 15c is wider than a width (length "L1") of the inner side 15a. The opening 15 has a shape of which top side is longer than bottom side.

For convenience of explanation, a line segment Ls is illustrated in FIG. 2 in order to divide the light emitting element 3 in its thickness direction. Assume that a side upper than the line segment Ls of the light emitting element 3 is an upper portion 3a. Assume that a side lower than the line segment Ls of the light emitting element 3 is a lower portion 3b. The line segment Ls divide the space part 13 of the light emitting device A into an upper region 13a and a lower region 13b. The upper portion 3a and the upper region 13a are included in a region in which white arrows direct upward from the line segment Ls as boundary. The lower portion 3b and the lower region 13b are included in a region in which white arrows direct downward from the line segment Ls as boundary.

In the light-emitting-element housing member 1, the mounting part 12 is arranged at a position having a height where the center of the light emitting element 3 in its thickness direction is the center of the opening 15 in its height direction.

When the light emitting element 3 has a high light emitting intensity, such as a laser element, emits light, the light emitting element 3 itself goes into a high temperature state. The temperature of the vicinity of the light emitting element 3 becomes high in accordance therewith. In such a case, inside the space part 13 in which the light emitting element 3 is arranged, there presents difference in the temperature between the upper region 13a and the lower region 13b that are divided by using the line segment Ls illustrated in FIG. 2. In FIG. 2, for example, atmosphere gas in the space part 13 whose temperature has risen goes upward, and thus a temperature of the upper region 13a is higher than that of the lower region 13b.

The light emitting element 3 is easily affected by the temperature in its periphery, and there presents difference in a light emitting output power between a portion having a high temperature and a portion having a low temperature. When a temperature of the upper portion 3a is higher than that of the lower portion 3b in a thickness direction of the light emitting element 3, a light emitting output power of the upper portion 3a is higher than that of the lower portion 3b in the thickness direction of the light emitting element 3, and thus a light emitting intensity of the lower portion 3b becomes small.

The light-emitting-element housing member 1 is capable of reducing difference in a light emitting intensity between the upper portion 3a and the lower portion 3b in the thickness direction of the light emitting element 3. Even in a case where a light emitting output power of the upper portion 3a is lower than that of the lower portion 3b in the thickness direction of the light emitting element 3, when an upper side of the opening 15 of the light-emitting-element housing member 1 is widened, it is possible to reduce difference in a light emitting intensity of light emitted from the opening 15 between the upper portion 3a and the lower portion 3b in the thickness direction of the light emitting element 3.

Figure 4:
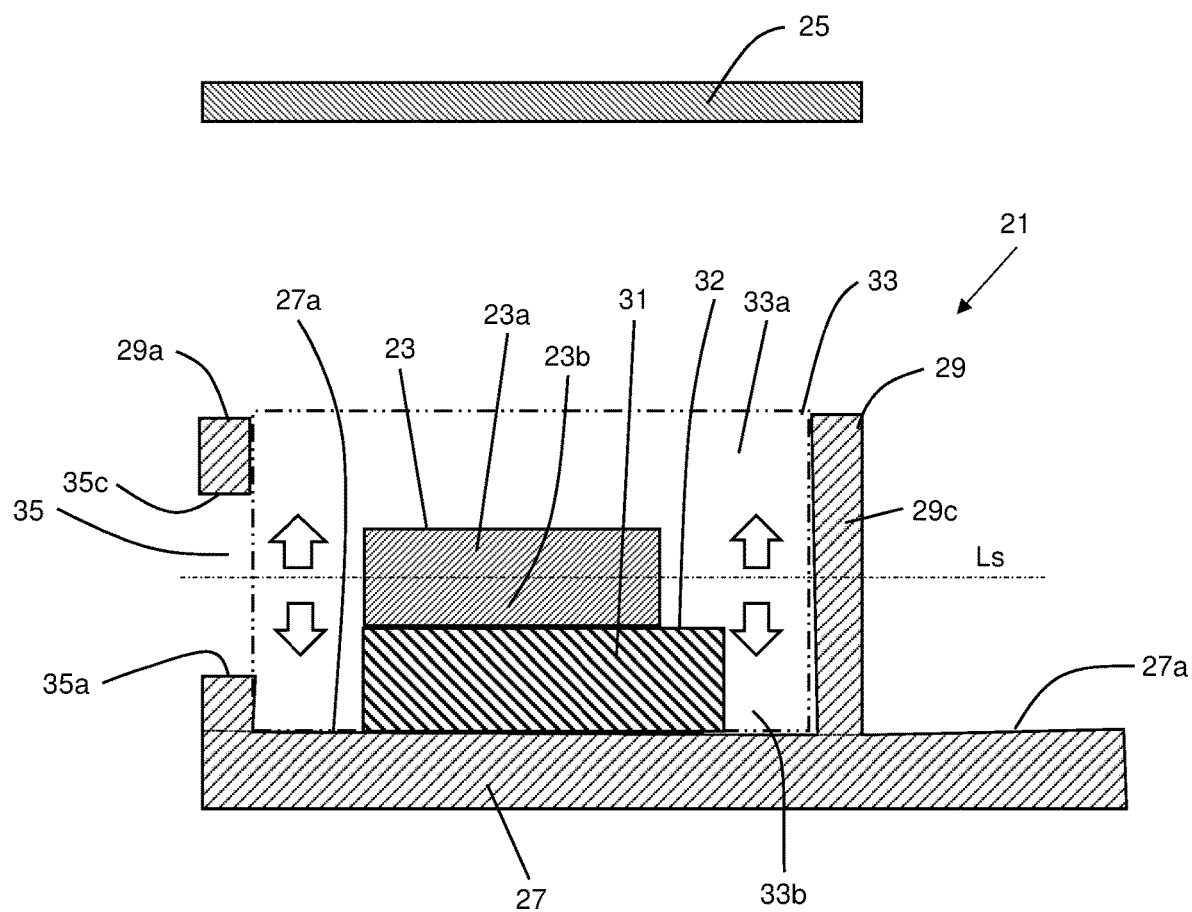
FIG. 4 is a cross-sectional view taken along a line iv-iv illustrated in FIG. 3.

A light emitting device B according to other modes illustrated in FIGS. 3 and 4 will be compared with the light emitting device A. Reference symbols of parts of the light emitting device B illustrated in FIGS. 3 and 4 are 21: light-emitting-element housing member, 23: light emitting element, 25: lid part, 27: bottom base material, 27a: first surface, 29: frame member, 29a, 29b, 29c, 29d: side wall, 31: base, 32: mounting part, 33: space part, 35: opening, 35a: first side, 35c: second side, L11: length (width) of first side, and L12: length (width) of second side.

The opening 35 of the light-emitting-element housing member 21 illustrated in FIGS. 3 and 4 is rectangular-shaped. Namely, in the opening 35, a length "L11" of the first side 35a is equal to a width "L12" of the second side 35c.

When the opening 35 is rectangular-shaped, a light emitting output power of an upper portion 23a is lower than that of a lower portion 23b in the thickness direction of the light emitting element 23, and light is emitted from the opening 35 while maintaining a state where the light emitting output power of the upper portion 23a is lower than that of the lower portion 23b in the thickness direction of the light emitting element 23, thereby leading to a large difference in a light emitting intensity of light emitted from the opening 15 between an upper region 33a and a lower region 33b of the space part 33.

On the other hand, in the opening 15 of the above-mentioned light-emitting-element housing member 1, the length (width) "L2" of the second side 15c is longer than the length "L1" of the first side 15a. In this case, a ratio L2/L1 may be 1.05 to 1.20. When a ratio L2/L1 is equal to or less than 1.20, the directivity of light output from the light emitting element 3 is able to be maintained.

The light-emitting-element housing member 1 may be formed of ceramic. Specifically, all of the bottom base material 7, the frame member 9, and the base 11, which are constituting the light-emitting-element housing member 1, may be formed of ceramic.

Moreover, the bottom base material 7, the frame member 9, and the base 11 may be integrally sintered. As such a ceramic, for example, alumina, silica, mullite, cordierite, forsterite, aluminum nitride, silicon nitride, silicon carbide, glass ceramic, or the like is possible. It is possible that the light-emitting-element housing member 1 contains, as a main component, aluminum nitride (AlN) because its thermal conductivity is high and its thermal expansion rate is similar to that of the light emitting element 3.

Herein, "containing aluminum nitride as main component" means that the light-emitting-element housing member 1 contains equal to or more than 80% by mass of aluminum nitride. Moreover, it is possible that the light-emitting-element housing member 1 contains equal to or more than 90% by mass of aluminum nitride. When a content of aluminum nitride is equal to or more than 90% by mass, a thermal conductivity of the light-emitting-element housing member 1 is equal to or more than 150 W/mK, so that it is possible to realize the light-emitting-element housing member 1 having an excellent heat dissipation.

A bonding layer (not illustrated) is arranged on an upper surface of the frame member 9 constituting the light-emitting-element housing member 1 in order to bond the lid part 5. The bonding layer and the above-mentioned terminals for power source 14a and 14b may be formed by using metalized films obtained by sintering metal powder. The metalized film is able to be bonded, with a strong adhesive force, to a surface of the ceramic constituting the light-emitting-element housing member 1. Thus, it is possible to realize the light-emitting-element housing member 1 that has a high reliability. When the bonding layer is a metalized film, the airtightness of the space part 13 is able to be improved.

A plating film of Ni or the like may be formed on a surface of the metalized film. Furthermore, on a surface of the plating film, a plating film of solder or Au—Sn may be formed.

The lid part 5 may be formed of metal material, ceramic, or the like. For example, kovar (Fe—Ni—Co alloy) has a high heat-resisting property and a high heat dissipation and would be usable as the metal material.

In the light-emitting-element housing member 1 constituting the light emitting device A illustrated in FIG. 1, the opening 15 has, as the inner edge 15A, a third side 15b and a fourth side 15d directed vertically with respect to the first surface 7a, which are forming a quadrangle between the first side 15a and the second side 15c.

In the opening 15 of the light-emitting-element mounted member 1, it is possible that a length "L3" in vertical direction with respect to the first surface 7a of the bottom base material 7 is longer than a length "L2" of the second side 15c. The length "L3" indicates the maximum length of lengths in the vertical direction with respect to the first surface 7a of the bottom base material 7 between the first side 15a and the second side 15c. It is possible that the opening 15 is vertically long (L3>L2). It is possible that a ratio L3/L2 is 1.05 to 1.20.

Commonly, a cross-sectional shape of light emitted from the light emitting element 3 is substantially vertically-long ellipse-shaped. When a shape of the opening 15 is vertically long (L3>L2), the shape of the opening 15 becomes similar to the cross-sectional shape of light emitted from the light emitting element 3, so that it is possible to reduce a ratio of light that is emitted from the light emitting element 3 and is further reflected from the side wall 9a of the frame member 9. Thus, it is possible to increase an amount of light passing through the opening 15.

Figure 5:
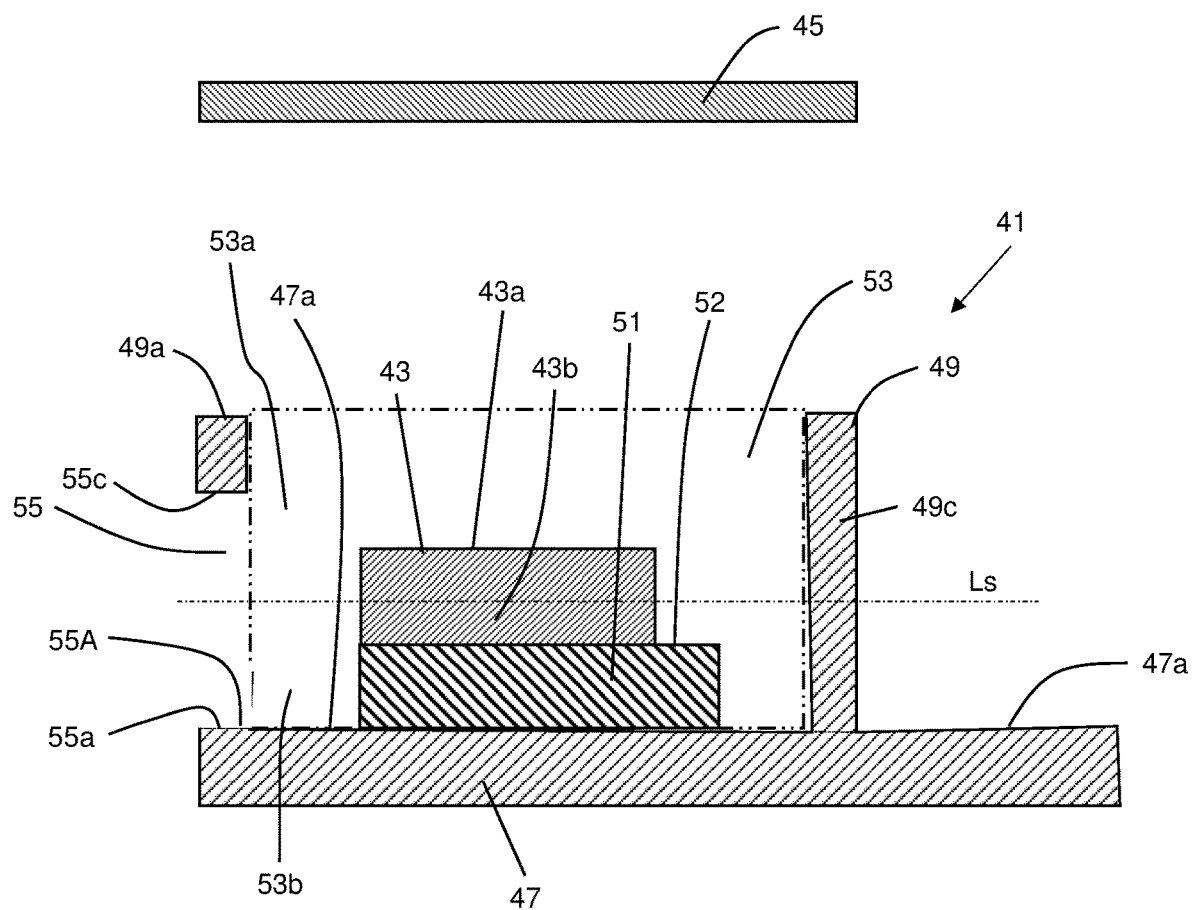
FIG. 5 is a cross-sectional view schematically illustrating other modes of the light emitting device.

FIG. 5 is a cross-sectional view schematically illustrating other modes of the light emitting device. Reference symbols constituting a light emitting device C illustrated in FIG. 5 are 41: light-emitting-element mounted member, 43: light emitting element, 45: lid part, 47: bottom base material, 47a: first surface, 49: frame member, 49a, 49c: side wall, 51: base, 52: mounting part, 53: space part, 55: opening, 55A: inner edge, 55a: first side, and 55c: second side.

In the light-emitting-element housing member 41 illustrated in FIG. 5, it is possible that the first side 55a closer to the first surface 47a, which is a surface of the bottom base material 47, among sides constituting the inner edge 55A of the opening 55 is positioned at a height similar to that of the first surface 47a that is a surface of the bottom base material 47. Specifically, the first surface 47a of the bottom base material 47 is a part corresponding to the first side 55a among the sides of the opening 55.

For example, when the first side 55a closer to the first surface 47a of the bottom base material 47 is positioned at a height similar to that of the first surface 47a of the bottom base material 47, it is possible to enlarge a size (area) of the opening 55. As illustrated in FIG. 5, when the light emitting element 43 is placed on the mounting part 52 that is an upper surface of the base 51, it is possible to increase an amount of light passing through the opening 55 from a lower region 53b of the space part 53. In this case, it is similarly possible that the mounting part 52 of the base 51 is arranged at a height where the center of the light emitting element 43 in its thickness direction is a center portion of the opening 55 in its height direction.

Figure 6:
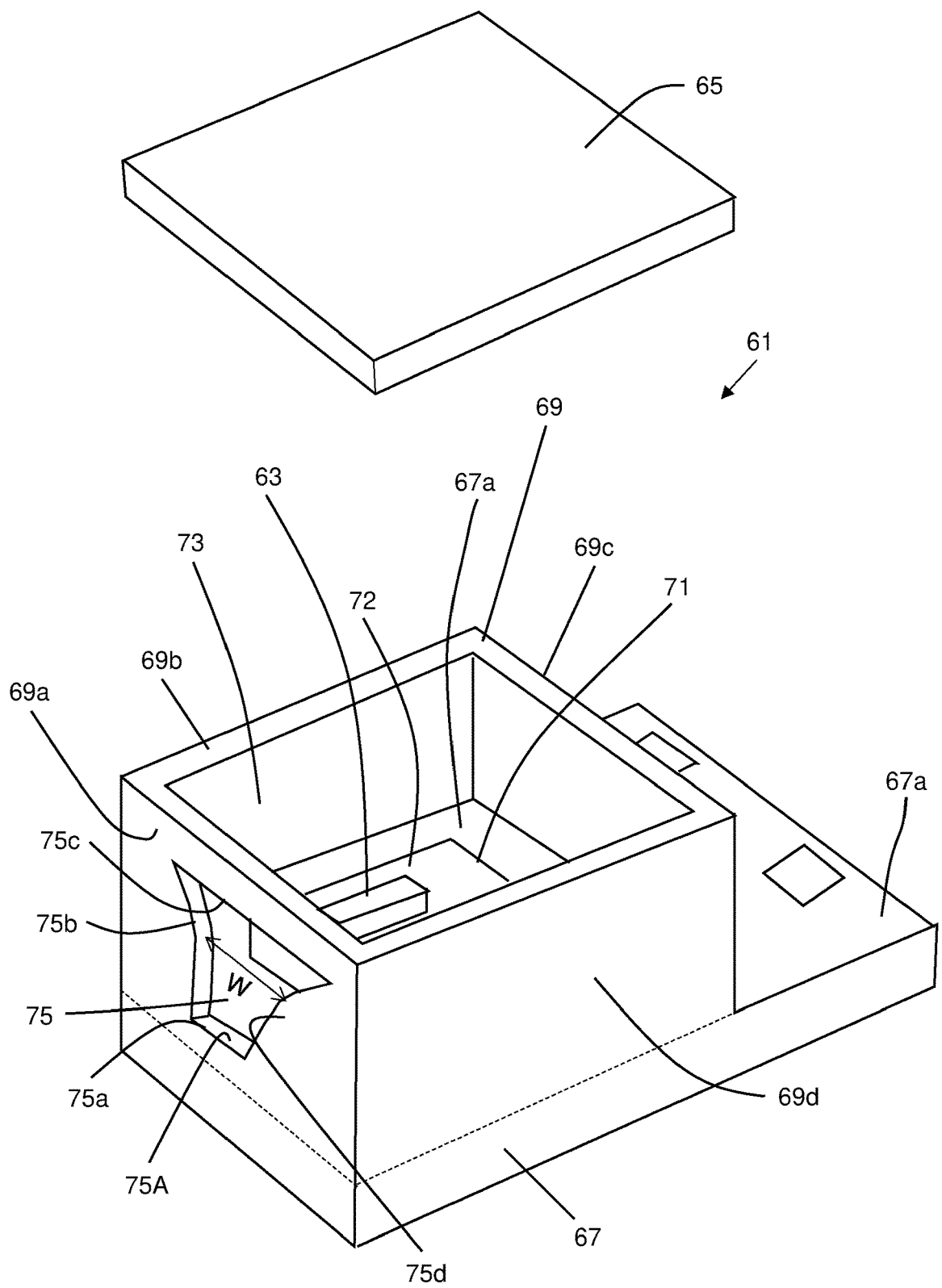
FIG. 6 is an exploded perspective view illustrating other modes of the light emitting device.

FIG. 6 is an exploded perspective view illustrating other modes of the light emitting device. Reference symbols of parts of a light emitting device D illustrated in FIG. 6 are 61: light-emitting-element housing member, 63: light emitting element, 65: lid part, 67: bottom base material, 67a: surface of bottom base material, 69: frame member, 69a, 69b, 69c, 69d: side wall, 71: base, 72: mounting part, 73: space part, 75: opening, 75a: first side, 75b: third side, 75c: second side, and 75d: fourth side.

The light-emitting-element housing member 61 illustrated in FIG. 6 is different in a shape of the opening 75 from the light-emitting-element housing member 1 illustrated in FIG. 1. A width W between the third side 75b and the fourth side 75d of the opening 75 formed in the light-emitting-element housing member 61 is curved and increased from a side of the first surface 67a of the bottom base material 67 toward a side of an upper part of the frame member 69. In other words, the opening 75 is opened in a skirt shape from the side of the bottom base material 67 toward the side of upper part of the frame member 69. In other words, an interval (reference symbol is "W") between the third side 75b and the fourth side 75d, which constitute the inner edge 75A of the opening 75, gradually increases from the first side 75a toward the second side 75c, and a ratio of enlargement of its length accordingly increases.

Each of the third side 75b and the fourth side 75d of the inner edge 75A of the opening 75 has a shape convexly curving toward the inside. In a case where each of the third side 75b and the fourth side 75d has a shape convexly curving toward the inside, the opening 75 is difficult to be deformed even when the temperature of the space part 73 is high, compared with the case where each of the third side 75b and the fourth side 75d is linearly shaped. Thus, the light-emitting-element housing member 61 is capable of maintaining a stable light emitting intensity. Each of the inner sides 75b and 75d of the opening 75 has a shape convexly curving toward the inside, so that it is possible to improve the directivity and light condensing property of light emitted from the center portion having a high light emitting intensity.

Figure 7:
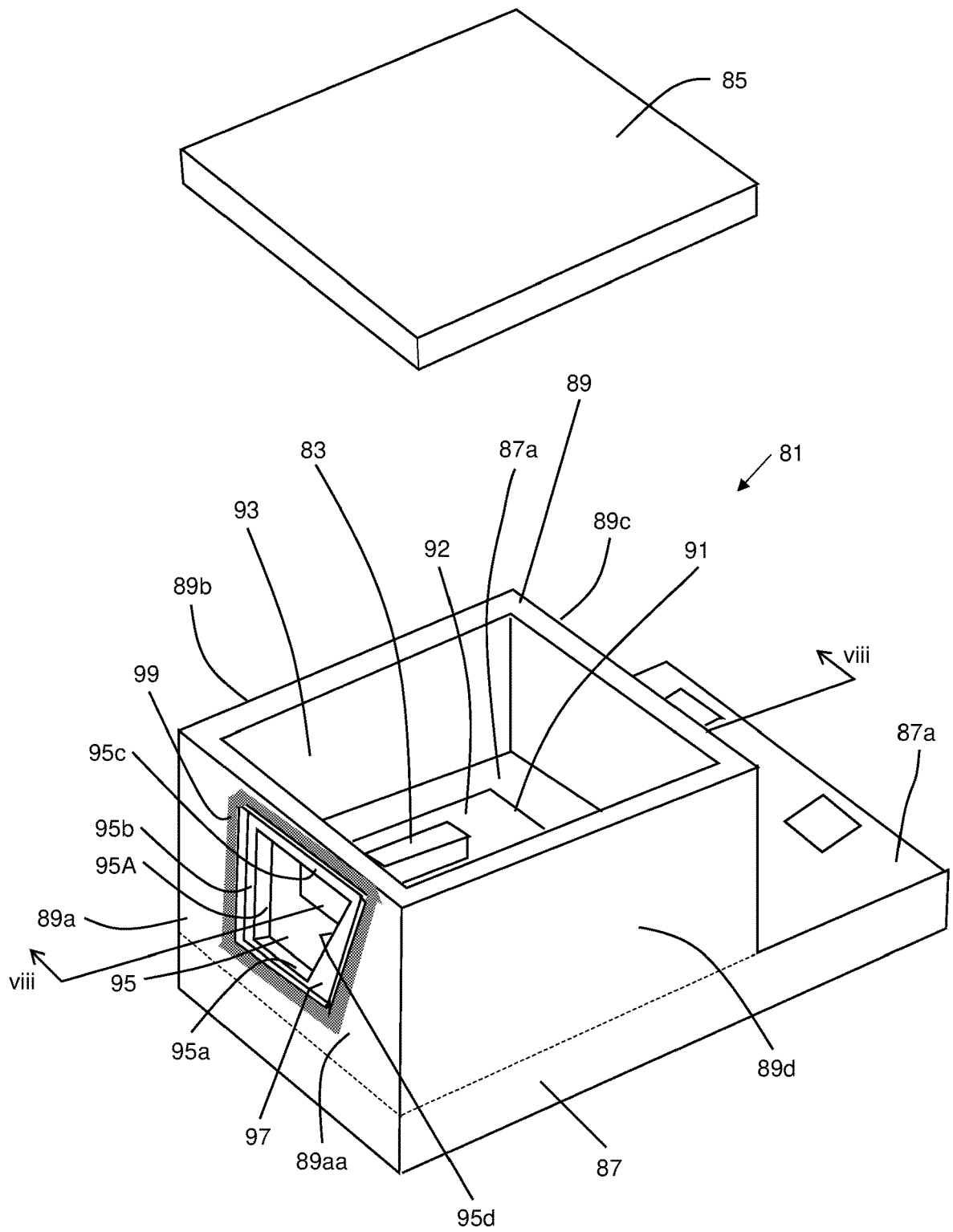
FIG. 7 is an exploded perspective view illustrating other modes of the light emitting device.
Figure 8:
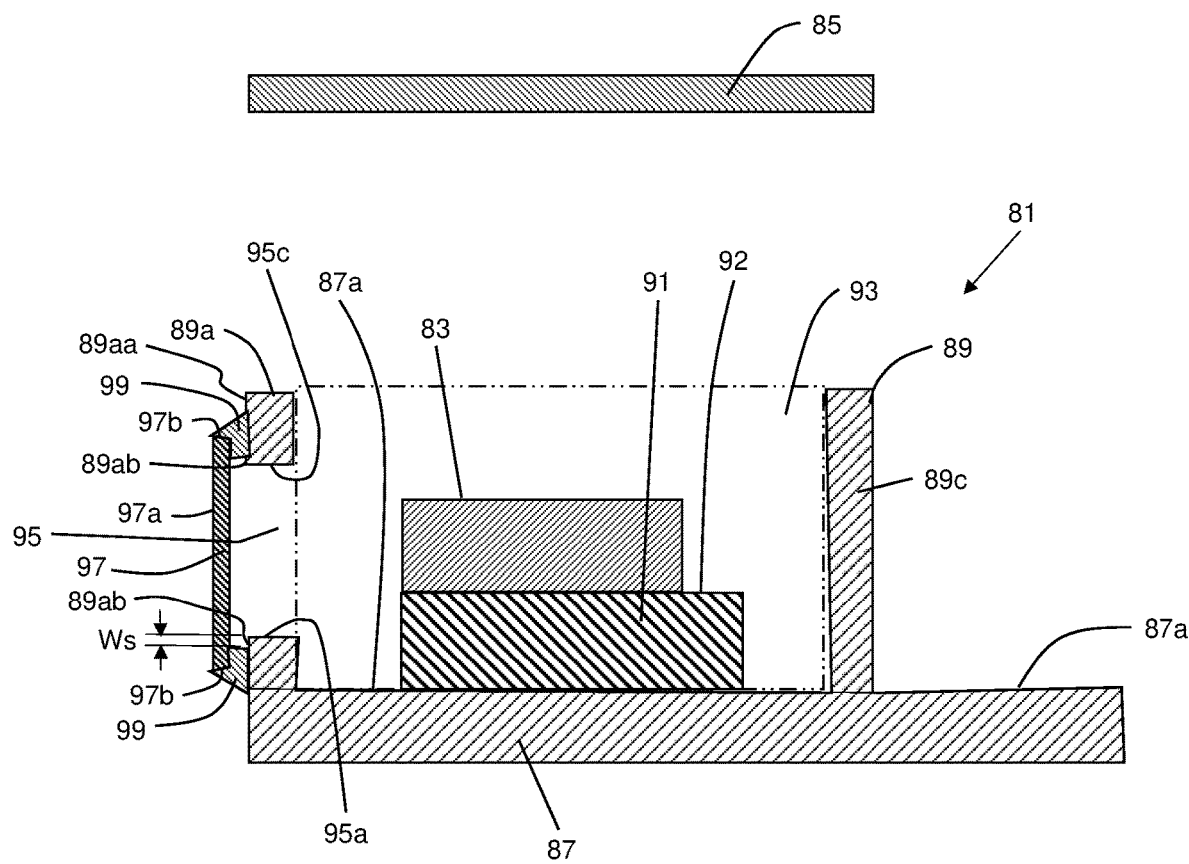
FIG. 8 is a cross-sectional view taken along a line viii-viii illustrated in FIG. 7.

FIG. 7 is an exploded perspective view illustrating other modes of the light emitting device. Note that the cross-sectional view taken along the line viii-viii illustrated in FIG. 7 indicates a surface perpendicular to a first surface 87a through the line viii-viii. A direction directed by arrows at both ends of the line viii-viii indicates a direction in which the cross-sectional view taken along the line viii-viii is viewed. FIG. 8 is a cross-sectional view taken along a line viii-viii illustrated in FIG. 7. A light emitting device E illustrated in FIG. 7 is based on the light emitting device A illustrated in FIG. 1. Reference symbols of parts of the light emitting device E are 81: light-emitting-element housing member, 83: light emitting element, 85: lid part, 87: bottom base material, 87a: surface of bottom base material, 89: frame member, 89a, 89b, 89c, 89d: side wall, 89aa: external surface of side wall 89a, 89ab: non-arranged part, 91: base, 92: mounting part, 93: space part, 95: opening, 95A: inner edge, 95a: first side, 95b: third side, 95c: second side, 95d: fourth side, 97: transparent member, and 99: bonding material.

The light emitting device E includes the transparent member 97. The transparent member 97 is arranged on the external surface 89aa on an outer side of the frame member 89 constituting the light-emitting-element housing member 81. The transparent member 97 has a configuration to cover the opening 95 via the bonding material 99. The transparent member 97 is arranged on the external surface 89aa of the side wall 89a of the frame member 89. In this case, the transparent member 97 is bonded to the external surface 89aa of the side wall 89a of the frame member 89 via the bonding material 99.

There is left a portion to which the bonding material 99 is not applied in the periphery of the opening 95 of the external surface 89aa of the side wall 89a. The portion to which the bonding material 99 is not applied may be referred to as the non-arranged part 89ab. In other words, there presents the non-arranged part 89ab on which the bonding material 99 is not arranged in the periphery of the opening 95 of the external surface 89aa of the side wall 89a. The non-arranged part 89ab is a part of the external surface 89aa of the side wall 89a of the frame member 89. The bonding material 99 is not close to the inner edge 95A of the opening 95. The bonding material 99 is applied to a position that is separated from each of the first side 95a, the second side 95c, the third side 95b, and the fourth side 95d by a predetermined width Ws.

Thus, it is possible to reduce possibility that light having passed through the opening 95 is absorbed into the bonding material 99. In other words, it is possible to reduce attenuation of light generated from the light emitting element 83. As a result, an amount of light having passed through the opening 95 is large, and thus light emitting intensity becomes high. Depending on a size of the light-emitting-element housing member 81, it is possible that the width Ws of the non-arranged part 89ab is 0.1 to 100 μm.

The transparent member 97 is arranged in such a manner that a part of the transparent member 97 is embedded in the bonding material 99. The state in which a part of the transparent member 97 is embedded in the bonding material 99 is a state in which the bonding material 99 is bonded not only to a principal surface 97a but also to an edge surface 97b of the transparent member 97. Therefore, it is possible to increase a bonding area between the transparent member 97 and the bonding material 99. Thus, it is possible to improve the airtightness of the opening 95.

The transparent member 97 is in a state where the transparent member 97 is mounted on the bonding material 99 arranged on the external surface 89aa of the side wall 89a of the frame member 89. The transparent member 97 is not in contact with the external surface 89aa of the side wall 89a of the frame member 89, and is separated from the external surface 89aa. The transparent member 97 is not in contact with the frame member 89, and thus the transparent member 97 hardly receives effects of the temperature and the thermal expansion of the frame member 89. The transparent member 97 is hardly affected by the frame member 89. The transparent member 97 becomes difficult to be bent and further becomes difficult to be distorted. Thus, the light having passed through the transparent member 97 is hardly refracted and is further hardly reflected.

Furthermore, the transparent member 97 is separated from the frame member 89, and thus even when seam welding is performed so as to bond the lid part 85 to an upper surface of the frame member 89, it is possible to reduce thermal stress generated between the transparent member 97 and the frame member 89. Accordingly, it is possible to prevent a crack from occurring in at least one of the frame member 89 and the transparent member 97, or further to prevent at least one of the frame member 89 and the transparent member 97 from being broken.

It is possible that the light-emitting-element housing members 1, 41, 61, and 81 respectively include bases 11, 31, 61, 71, and 91 protruding from the first surfaces 7a, 47a, 67a, and 87a of the bottom base materials 7, 47, 67, and 87. Hereinafter, for convenience of explanation, the members and reference symbols thereof illustrated in FIGS. 1 and 2 are used in explanation of a base. It is needless to say that the parts illustrated herein may be applied not only to the light-emitting-element housing member 1 illustrated in FIG. 1, but also to the light-emitting-element housing members 41, 61, and 81 illustrated in FIGS. 5 to 8.

In the light-emitting-element housing member 1, the base 11 is arranged in a position separated from the frame member 9. A periphery of the base 11 has a height same as that of the first surface 7a of the bottom base material 7. In other words, the base 11 has a structure protruding from the first surface 7a of the bottom base material 7 in an island shape. The mounting part 12, which is a surface of the base 11, is arranged in a position that is higher than the first surface 7a of the bottom base material 7. The surface of the base 11 is the mounting part 12.

When the base 11 is placed on the bottom base material 7 and the surface of the base 11 is used as the mounting part 12 of the light emitting element 3, the light emitting element 3 is accordingly arranged at a position that is higher than the first surface 7a of the bottom base material 7. Thus, it is possible to prevent light radiated from the light emitting element 3 from being reflected from the first surface 7a of the bottom base material 7, or from being absorbed in the first surface 7a of the bottom base material 7. It is possible to ease reduction in an amount and reduction in light emitting intensity of the light radiated from the light emitting element 3. In this case, as illustrated in FIG. 5, in the opening 15, it is possible that the first side 15a closer to the first surface 7a of the bottom base material 7 is arranged at a position having a height same as that of the first surface 7a of the bottom base material 7. When the base 11 is arranged on the bottom base material 7 and the opening 15 is extended toward the lower side, it is possible to reduce attenuation of light generated from the lower portion 3b of the light emitting element 3.

Figure 9:
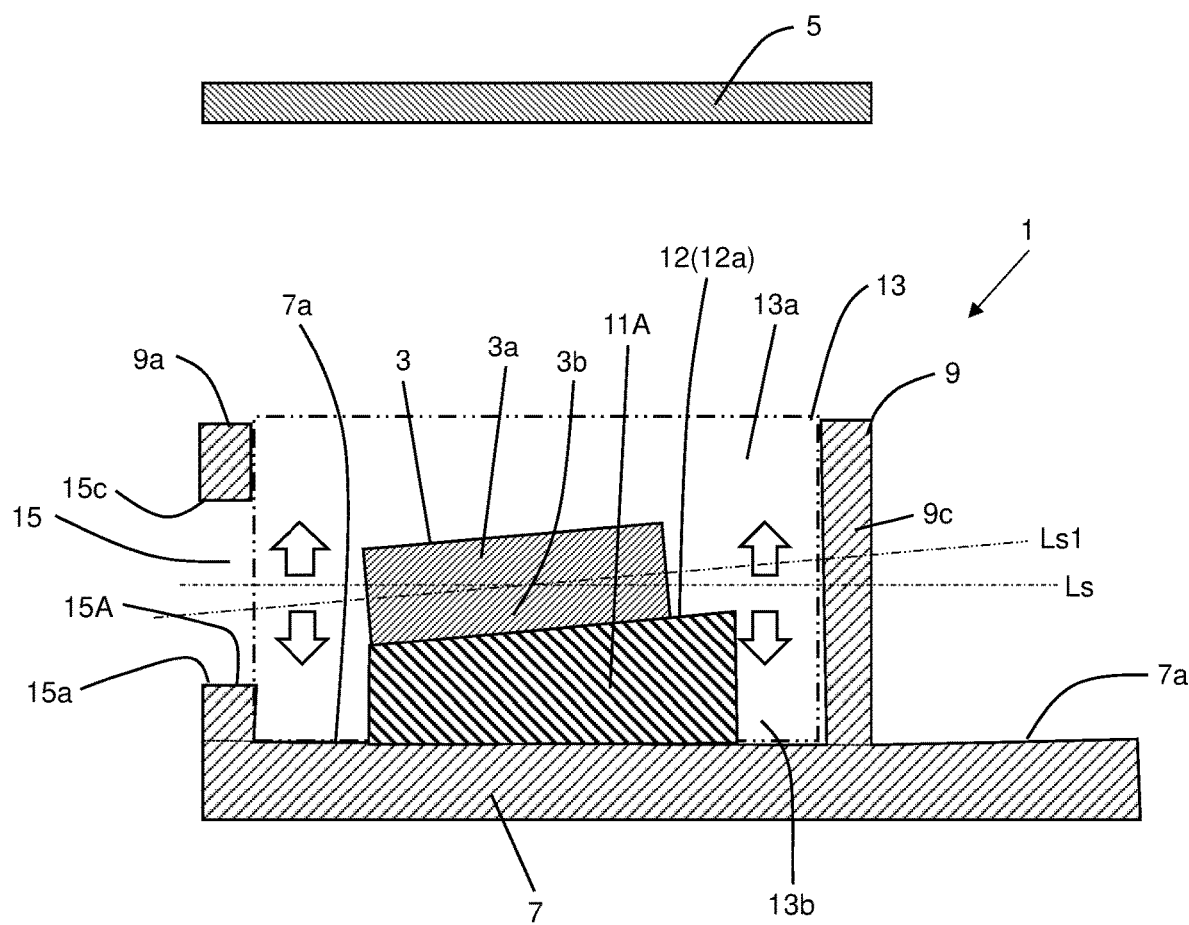
FIG. 9 is a cross-sectional view schematically illustrating other modes of the light emitting device.

FIG. 9 is a cross-sectional view schematically illustrating other modes of the light emitting device. In this case, the members and reference symbols thereof illustrated in FIGS. 1 and 2 will be used except for the base 11. The light-emitting-element mounted member 1 illustrated in FIG. 9 indicates a structure in which a surface (surface of base 11A) of the mounting part 12 of a base 11A is inclined with respect to the first surface 7a. In the light-emitting-element housing member 1 illustrated in FIG. 9, the surface of the mounting part 12 of the base 11A is inclined with respect to the first surface 7a. Hereinafter, the surface of the mounting part 12 may be referred to as a mounting surface 12a. In FIG. 9, a reference symbol "Ls1" is provided to a line segment (two-dot chain line) that divides the light emitting element 3 between the upper portion 3a and the lower portion 3b in the thickness direction of the light emitting element 3. In FIG. 9, the line segment Ls (dashed line), which is illustrated in FIG. 2, is also illustrated for comparison. The line segment Ls1 is in a direction along the mounting surface 12a, and thus is in a direction that is inclined with respect to the opening 15.

Specifically, the mounting surface 12a is formed to have a slope by an elevation angle when viewing the space part 13 from the opening 15 side. In a case of the structure in which the mounting surface 12a has an elevation angle from the opening 15 side, when the light emitting element 3 is mounted on the mounting surface 12a and emits light, a position obtained by extending a center axis (line segment Ls1) of the emitted light in the opening 15 is on a lower side than the center position of the opening 15. Namely, the center position of the emitted light is closer to the first side 15a positioned on a lower side of the opening 15 than the second side 15c positioned on an upper side of the opening 15. When the center position of the emitted light is closer to the first side 15a positioned on a lower side of the opening 15 than the second side 15c positioned on an upper side of the opening 15, a ratio of the emitted light spreading over the upper portion 3a of the space part 13 is reduced. Thus, a rise in the temperature of the upper region 13a of the space part 13 is reduced. As a result, it is possible to reduce difference in a light emitting intensity of light emitted from the opening 15 between the upper portion 3a and the lower portion 3b in the thickness direction of the light emitting element 3.

It is possible that an angle with respect to the first surface 7a of the mounting surface 12a of the base 11A is equal to or more than 0.5° and equal to or less than 5°. When the angle with respect to the first surface 7a of the mounting surface 12a of the base 11A is equal to or more than 0.5° and equal to or less than 5°, it is possible to reduce the ratio of emitted light spreading over the upper portion 3a of the space part 13. Moreover, it is further possible to reduce a rise in the temperature of the upper region 13a of the space part 13. Furthermore, it is possible to reduce a deviation in a direction of the emitted light.

It is needless to say that the structure, in which the surface (surface of base 11A) of the mounting part 12 of the base 11A is inclined with respect to the first surface 7a, may be similarly applied not only to the above-mentioned light-emitting-element housing member 1 illustrated in FIG. 1, but also to the light-emitting-element housing members 41, 61, and 81 illustrated in FIGS. 5 to 8.

Figure 10:
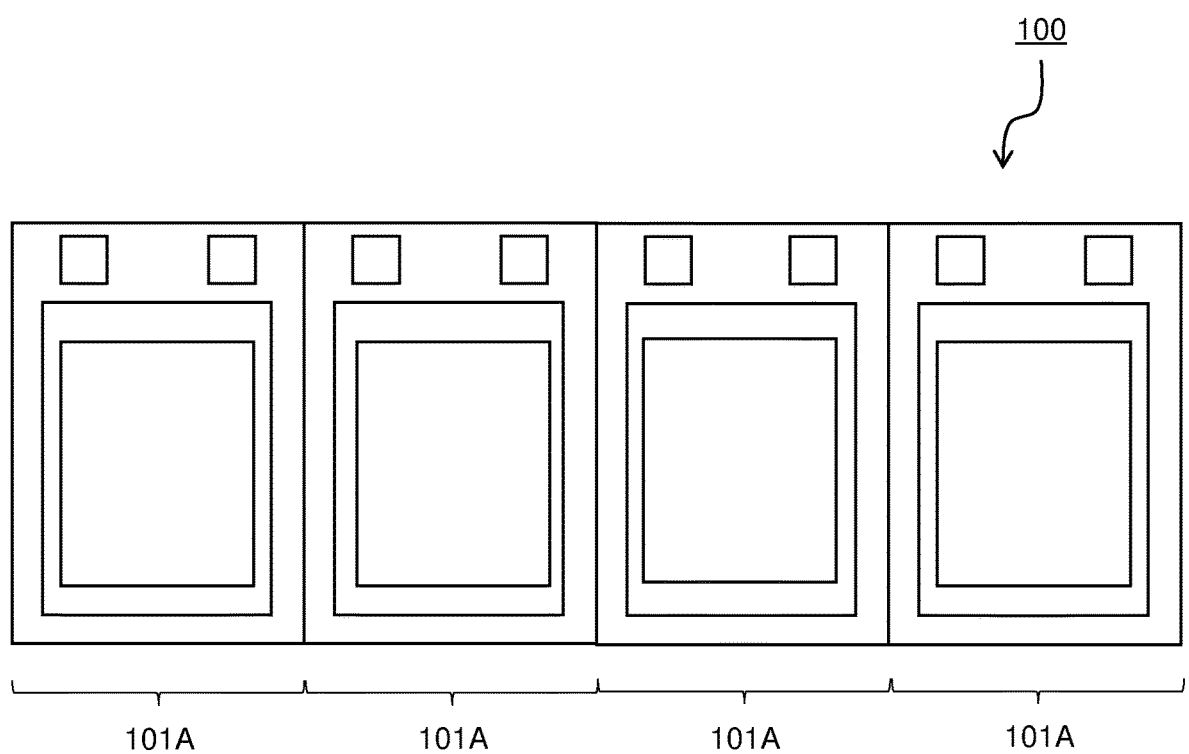
FIG. 10 is a plan view schematically illustrating embodiments of an array member.

FIG. 10 is a plan view schematically illustrating embodiments of an array member. An array member 100 illustrated in FIG. 10 is obtained by connecting a plurality of light-emitting-element housing members 101A. To the light-emitting-element housing member 101A, for example, the light-emitting-element housing member 1 illustrated in FIGS. 1 and 2 among the above-mentioned light-emitting-element housing members may be applied. It is needless to say that the light-emitting-element housing member 101A constituting the array member 100 may be similarly applied not only to the light-emitting-element housing member 1 illustrated in FIGS. 1 and 2, but also to the light-emitting-element housing members 41, 61, and 81 illustrated in FIGS. 5 to 8.

The light emitting device has a configuration in which the light emitting elements are mounted on the respective mounting parts of the light-emitting-element housing members 101A constituting the array member 100, and a lid part is provided to an upper surface of the frame member constituting the light-emitting-element housing member 101A.

In a case of a configuration in which the light-emitting-element housing members 101A are connected with each other, multi-chipping is able to be implemented while maintaining a shape and a size of the light-emitting-element housing member 101A. Thus, a small-sized light emitting device obtained by integrating a plurality of light emitting elements is able to be obtained. In this case, it is possible that the connected light-emitting-element housing members 101A are sintered to be integrated. The thermal conductivity between surfaces of the light-emitting-element housing members 101A becomes higher than that in a case where the light-emitting-element housing members 101A are connected with each other by using a material other than the material constituting the light-emitting-element housing members 101A, such as a connector, so that it is possible to obtain an array-type light emitting device having a high heat dissipation and a high intensity.

Moreover, each of the light-emitting-element housing members 101A has a configuration in which an upper side of the opening is wider than a lower side thereof, so that it is possible to reduce difference in light emitting intensity between the upper portion and the lower portion in a thickness direction of the light emitting element.

Figure 11:
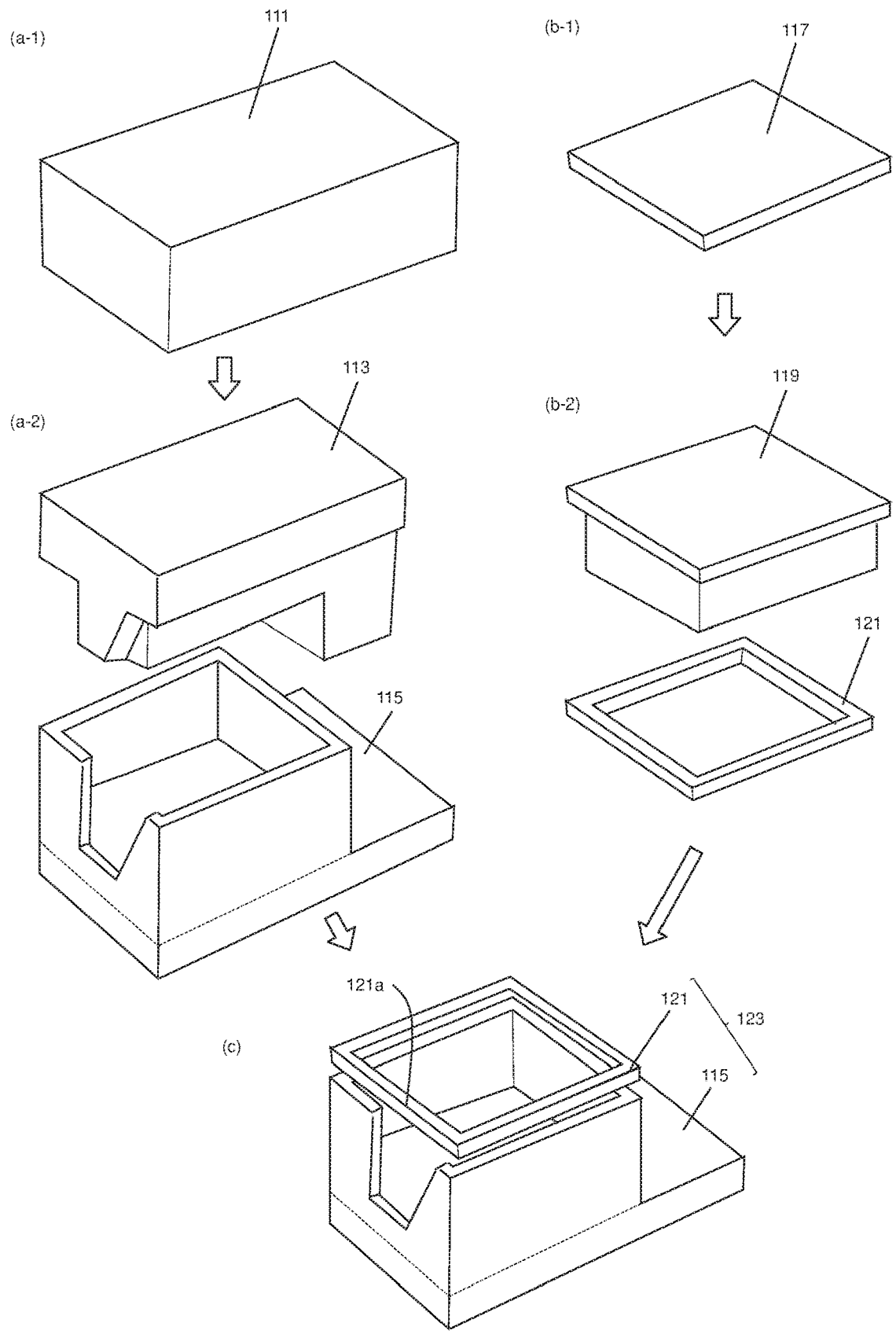
FIG. 11 is a process diagram illustrating fabrication of a laminated molded body to be used for a light-emitting-element housing member.

Next, a method for fabricating the above-mentioned light-emitting-element housing member 1 and the light emitting device A will be explained. FIG. 11 is a process diagram for fabricating a laminated molded body for a light-emitting-element housing member.

First, as illustrated in FIG. 11(a-1), there is prepared a raw-groundwork molded body 111 for molding. The raw-groundwork molded body 111 contains ceramic powder and organic binder, and has characteristics of plastic deformation during its formation.

Next, as illustrated in FIG. 11(a-2), the groundwork molded body 111 is pressurized by using a molding metal die 113. Thus, a main molded body 115 is able to be fabricated, which is to be a lower portion of the light-emitting-element housing member 1. In this case, a metal layer pattern may be formed on a surface of the groundwork molded body 111 in order to simultaneously therewith form a conductor such as a terminal for power source.

On the other hand, as illustrated in FIG. 11(b-1), there is prepared a sheet-shaped molded body 117. Next, as illustrated in FIG. 11(b-2), the sheet-shaped molded body 117 is pressurized by a convex metal die 119, and the sheet-shaped molded body 117 is hollowed out by removing its center portion so as to fabricate a frame-shaped molded body 121.

Next, as illustrated in FIG. 11 (c), the frame-shaped molded body 121 fabricated in the process (b-2) is overlapped with an upper side of the main molded body 115 fabricated in the process (a-2) and they are integrated with each other so as to fabricate a laminated molded body 123 to be used for the light-emitting-element housing member. By overlapping the frame-shaped molded body 121 with the main molded body 115, a part of the frame-shaped molded body 121 becomes a bridge part 121a of the opening formed in the laminated molded body 123. Next, the laminated molded body 123 is fired to obtain the light-emitting-element housing member 1.

As described above, in FIG. 11, there is exemplified the method for fabricating the light-emitting-element housing member 1 illustrated in FIGS. 1 and 2; however, the above-mentioned fabricating method is not limited thereto, and when changing a shape of the molding metal die, for example, the light-emitting-element housing members 41 and 61 illustrated in FIGS. 5 and 6 may be fabricated.

In order to fabricate a connection-type molded body to be the array member 100, first, there are prepared the groundwork molded body 111 and the sheet-shaped molded body 117 whose sizes have been adjusted, on the other hand, there are prepared a connected-type molding metal die obtained by connecting the plurality of molding metal dies 113 and a connected-type convex metal die obtained by connecting the plurality of convex metal dies 119.

Next, by using the connected-type molding metal die and the connected-type convex metal die, pressurized forming and laminating are performed on the groundwork molded body 111 and the sheet-shaped molded body 117 whose sizes are adjusted, so as to fabricate the connection-type laminated molded body to be the array member 100.

Practical Example

Hereinafter, light-emitting-element housing members, whose shapes of the openings were according to modes illustrated in FIGS. 1, 3, 6, and 9, were specifically fabricated, the light emitting devices to which the light-emitting-element housing members were applied were fabricated, and their light-emitting intensity ratios were evaluated.

There were prepared a groundwork molded body and a sheet-shaped molded body that were fabricated by mixing (i) mixed powder, which was obtained by mixing powders including a ratio of 94% by mass of aluminum nitride powder, 5% by mass of $Y_2O_3$ powder, and 1% by mass of CaO powder, and (ii) acrylic binder.

Next, on one of surfaces of the groundwork molded body, there were formed (i) a metal layer pattern to be a terminal for element for supplying electric power to a light emitting element and (ii) a metal layer pattern to be a terminal for power source. On a surface of a part that was to be a frame member of the laminated molded body, there was formed a metal layer pattern that was to be a ring-shaped bonding layer to be bonded to a lid part. Moreover, on a surface (reverse face) opposite to the surface on which the metal layer patterns to be the terminal for element and the terminal for power source were formed, a metal layer pattern to be wiring for connecting the terminal for element and the terminal for power source with each other was formed. The metal layer pattern was formed by a screen printing method using electrically conductive paste containing tungsten powder.

Next, a main molded body was fabricated from the groundwork molded body by the method illustrated in FIG. 11. Moreover, a frame-shaped molded body was fabricated from the sheet-shaped molded body.

Next, the frame-shaped molded body and the main molded body were overlapped with each other to be integrated with each other, and a laminated molded body to be a light-emitting-element housing member was fabricated.

Next, the fabricated laminated molded body was fired in reducing atmosphere for two hours under a condition whose maximum temperature was 1800° C. The fabricated light-emitting-element housing member after the firing had shape of width 2.5 mm×length 4.2 mm×thickness 1.08 mm. An opening of each fabricated light-emitting-element housing member was vertically-long-shaped. Vertically-long-shaped means that the maximum length in a direction perpendicular to the surface of the bottom board is longer than the maximum length in a direction along the surface. A side of an inner edge of the opening, which was closer to a surface of the bottom base material, was in a position having a height same as that of the surface of the bottom board.

Next, a Ni-plating film having a thickness of approximately 5 µm was formed on the conductor that was formed on the surface of the fired light-emitting-element housing member.

Next, in the opening of samples No. 1, 2, and 4, which was formed in the frame member of the light-emitting-element housing member, L1 was 0.55 mm, L2 was 0.60 mm, and L3 was 0.7 mm. In that of sample No. 3, both of L1 and L2 were 0.55 mm, and L3 was 0.7 mm. The light-emitting-element housing member of sample No. 4 was obtained by inclining, by 1°, a surface of the mounting part of the base of sample No. 1 with respect to the first surface. In this case, a center position in a longitudinal direction of the light emitting element and a center position in the thickness direction were the same between sample No. 4 and sample No. 1.

Low-melting-point glass paste was applied to a periphery of the opening and a glass plate was bonded thereto so as to cover the opening. A glass plate having an anti-reflective coating layer was employed for the glass plate. The low-melting-point glass paste was arranged so as not to be applied within a region whose distance from the opening was equal to or less than 0.1 mm. In this case, the region whose distance from the opening was equal to or less than 0.1 mm was a non-arranged part to which the low-melting-point glass paste was not applied. The glass plate was arranged on the low-melting-point glass paste so as not to be in contact with a frame member of the light-emitting-element housing member. In this case, the glass plate was in a state where a part of the glass plate on the opening side was embedded in the bonding material.

Next, a light emitting element was bonded to a mounting part of the obtained light-emitting-element housing member by using Au—Sn solder, and then a lid part made of kovar was bonded to a ring-shaped conductor by a seam welding method so as to fabricate a light emitting device. A semiconductor laser element (width 0.3 mm×length 1.2 mm×height 0.15 mm) whose oscillation wavelength was 462 nm was employed for the light emitting element. Au—Sn solder was employed in bonding the light emitting element to the mounting part.

Figure 12:
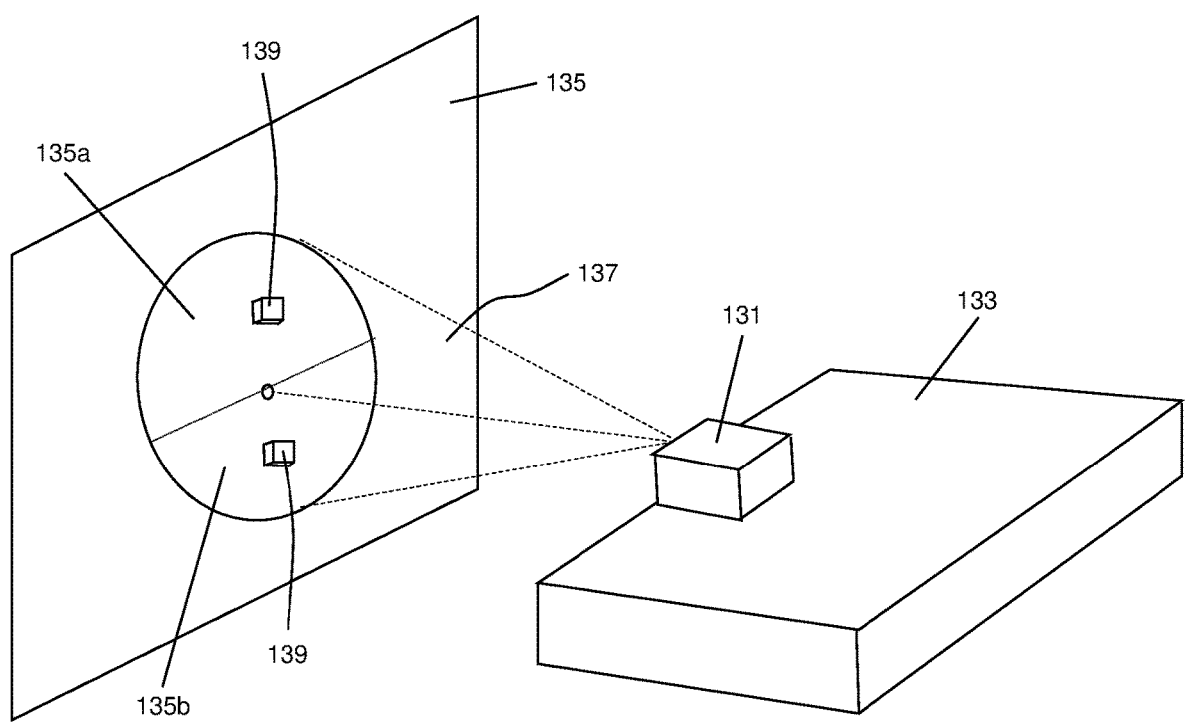
FIG. 12 is a conceptual diagram illustrating an evaluation device for obtaining a light-emitting intensity ratio of the light emitting device.

Next, with reference to an evaluation device illustrated in FIG. 12, evaluation of a light-emitting intensity ratio in the up-and-down direction was carried out on the light emitting device that was obtained by mounting the light emitting element on the light-emitting-element housing member. Specifically, a light emitting device 131 was mounted on a printed wiring board 133. The printed wiring board 133 used in the evaluation had a size of width 10 mm×length 10 mm×height 3 mm, and a flatness of a mounted surface on which the light-emitting-element housing member was mount was equal to or less than 5 µm.

Specifically, as illustrated in FIG. 12, a part of a flat plate 135 on which emitted light 137 is cast was divided into an upper region 135*a* and a lower region 135*b*, photodiodes 139 were arranged in the center portion of the respective regions, and a light emitting intensity in each of the regions was detected. Next, a ratio (Iup/Iun) was obtained between a light emitting intensity Iup of the upper region 135*a* and a light emitting intensity Iun of the lower region 135*b*. The number "n" of samples was 3 for each of the configurations, and a corresponding average value thereof was obtained. The light-emitting intensity ratios of the configurations are illustrated in Table 1.

TABLE 1

| Sample No. | Structure of Light-Emitting-Element Housing Member (Shape of Opening) | Light Emitting Intensity Ratio (Iup/Iun) |
|---|---|---|
| 1 | FIG. 1 | 0.9 |
| 2 | FIG. 6 | 1 |
| 3 | FIG. 3 | 0.6 |
| 4 | FIG. 9 | 0.92 |

As obvious from the results illustrated in Table 1, light-emitting intensity ratios of (i) sample No. 1 including the light-emitting-element housing member whose configuration was illustrated in FIG. 1, (ii) sample No. 2 including the light-emitting-element housing member whose configuration was illustrated in FIG. 6, and (iii) sample No. 4 including the light-emitting-element housing member whose configuration was illustrated in FIG. 9 were closer to "1" than that of sample No. 3 including the light-emitting-element housing member whose configuration was illustrated in FIG. 3. A reduction in a light intensity in the upper region of light generated from the light emitting element of samples No. 1, No. 2, and No. 4 was small.

Additional advantages and modifications will readily occur to those skilled in the art. Therefore, the broader aspects of the various embodiments are not limited to the specific details and representative embodiments shown and described herein. Accordingly, various modifications may be made without departing from the spirit or scope of the general inventive concept as defined by the appended claims and their equivalents.

What is claimed is:

1. A light-emitting-element housing member comprising:
   a bottom base material that includes a first surface, and mounting part on the first surface on which a light emitting element is to be mounted; and
   a frame member that includes side walls erected on the first surface to surround the mounting part, and an opening that penetrates through one of the side walls, wherein
   the opening includes an inner edge having a first side and a second side, the first side extending along the first surface and arranged at a position close to the bottom base material, and the second side extending along the first surface and arranged at a position farther from the bottom base material than the first side,
   the second side is longer than the first side, and
   a length of the opening in a direction perpendicular to the first surface is longer than the second side.

2. The light-emitting-element housing member according to claim 1, wherein
   the first side of the opening is at a height of the first surface.

3. The light-emitting-element housing member according to claim 1, wherein
   the inner edge of the opening is formed in a skirt shape widening from a bottom base material side toward an upper part side of the opening.

4. The light-emitting-element housing member according to claim 1, wherein
   a transparent member is arranged, via a bonding material, on an external surface of the one of the side walls, and
   the bonding material is not arranged in a non-arranged part comprising a periphery of the opening in the external surface.

5. The light-emitting-element housing member according to claim 4, wherein
   a part of the transparent member is embedded in the bonding material on an opening side of the bonding material that is closer to the opening.

6. The light-emitting-element housing member according to claim 4, wherein
   the transparent member is not in contact with the one of the side walls.

7. The light-emitting-element housing member according to claim 1, wherein
   the bottom base material includes a base protruding from the first surface of the bottom base material, and the base comprises the mounting part.

8. The light-emitting-element housing member according to claim 7, wherein
   the mounting part of the base is inclined with respect to the first surface.

9. An array member comprising a plurality of light-emitting-element housing members according to claim 1 connected in an array.

10. The array member according to claim 9, wherein
    the plurality of light-emitting-element housing members are integrally sintered.

11. A light emitting device comprising:
    a light emitting element mounted on the mounting part of the light-emitting-element housing member according to claim 1.

12. A light emitting device comprising:
    the array member according to claim 9; and
    a light emitting element arranged on the mounting part of each light-emitting-element housing member of the plurality of light-emitting-element housing members constituting the array.

13. A light-emitting-element housing member comprising:
    a bottom base material that includes a first surface, and mounting part on the first surface on which a light emitting element is to be mounted; and
    a frame member that includes side walls erected on the first surface to surround the mounting part, and an opening that penetrates through one of the side walls, wherein
    the opening includes an inner edge having a first side and a second side, the first side extending along the first surface and arranged at a position close to the bottom base material, and the second side extending along the first surface and arranged at a position farther from the bottom base material than the first side,
    the second side is longer than the first side,
    a transparent member is arranged, via a bonding material, on an external surface of the one of the side walls, and
    the bonding material is not arranged in a non-arranged part comprising a periphery of the opening in the external surface.

14. The light-emitting-element housing member according to claim 13, wherein
    the first side of the opening is at a height of the first surface.

15. The light-emitting-element housing member according to claim 13, wherein
    the inner edge of the opening is formed in a skirt shape widening from a bottom base material side toward an upper part side of the opening.

16. The light-emitting-element housing member according to claim 13, wherein
    a part of the transparent member is embedded in the bonding material on an opening side of the bonding material that is closer to the opening.

17. The light-emitting-element housing member according to claim 13, wherein
    the transparent member is not in contact with the one of the side walls.

18. The light-emitting-element housing member according to claim 13, wherein
    the bottom base material includes a base protruding from the first surface of the bottom base material, and the base comprises the mounting part.

19. The light-emitting-element housing member according to claim 18, wherein
    the mounting part of the base is inclined with respect to the first surface.

20. An array member comprising a plurality of light-emitting-element housing members according to claim 13 connected in an array.

21. The array member according to claim 20, wherein the plurality of light-emitting-element housing members are integrally sintered.

22. A light emitting device comprising:
a light emitting element mounted on the mounting part of the light-emitting-element housing member according to claim 13.

23. A light emitting device comprising:
the array member according to claim 20; and
a light emitting element arranged on the mounting part of each light-emitting-element housing member of the plurality of light-emitting-element housing members constituting the array.

\* \* \* \* \*